(12) United States Patent
Kim

(10) Patent No.: US 11,527,784 B2
(45) Date of Patent: *Dec. 13, 2022

(54) DEVICE AND METHOD FOR PREVENTING OVER-DISCHARGE OF ENERGY STORAGE DEVICE AND RE-OPERATING SAME

(71) Applicant: LG ENERGY SOLUTION, LTD., Seoul (KR)

(72) Inventor: Doe Gyun Kim, Seoul (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 449 days.

This patent is subject to a terminal disclaimer.

(21) Appl. No.: 16/604,865

(22) PCT Filed: Mar. 2, 2018

(86) PCT No.: PCT/KR2018/002536
§ 371 (c)(1),
(2) Date: Oct. 11, 2019

(87) PCT Pub. No.: WO2018/190512
PCT Pub. Date: Oct. 18, 2018

(65) Prior Publication Data
US 2020/0058965 A1 Feb. 20, 2020

(30) Foreign Application Priority Data
Apr. 12, 2017 (KR) .................. 10-2017-0047386

(51) Int. Cl.
*H02J 7/00* (2006.01)
*H01M 10/48* (2006.01)
(Continued)

(52) U.S. Cl.
CPC ........ *H01M 10/482* (2013.01); *G01R 31/382* (2019.01); *H01M 10/4207* (2013.01);
(Continued)

(58) Field of Classification Search
CPC .................................................. H01M 10/482
(Continued)

(56) References Cited

U.S. PATENT DOCUMENTS 11,271,256 B2 * 3/2022 Yoon ................... H01M 50/581
2002/0021108 A1 2/2002 Suzuki et al.
(Continued)

FOREIGN PATENT DOCUMENTS

CN 102324753 A 1/2012
CN 106410832 A 2/2017
(Continued)

OTHER PUBLICATIONS

European Search Report for Appl. No. 18784264.6 dated Nov. 13, 2019.
(Continued)

*Primary Examiner* — Yalkew Fantu
(74) *Attorney, Agent, or Firm* — Birch, Stewart, Kolasch & Birch, LLP

(57) ABSTRACT

Provided is an energy storage system including: an external power input unit receiving uninterrupted external power; a battery storing electric power; a power adjustment device adjusting the uninterrupted external power and the power of the battery, the battery including a battery module with one or more battery cells; a battery management system; a main switch disposed on a power path between the battery module and the battery management system and a path between the battery module and the power adjustment device; and a wake-up relay receiving a wake-up signal from the power adjustment device and transmitting the wake-up signal to the battery management system.

12 Claims, 3 Drawing Sheets

(51) Int. Cl.
  *G01R 31/382* (2019.01)
  *H01M 10/42* (2006.01)
  *H02J 9/00* (2006.01)
  *H02J 9/06* (2006.01)

(52) U.S. Cl.
  CPC .......... *H02J 7/0022* (2013.01); *H02J 7/0026* (2013.01); *H02J 7/0031* (2013.01); *H02J 7/0036* (2013.01); *H02J 9/005* (2013.01); *H02J 9/062* (2013.01); *H01M 2010/4271* (2013.01); *H02J 7/00306* (2020.01)

(58) Field of Classification Search
  USPC .......................................................... 320/127
  See application file for complete search history.

(56) References Cited

U.S. PATENT DOCUMENTS

| | | |
|---|---|---|
| 2012/0153726 A1 | 6/2012 | Moon |
| 2014/0167700 A1 | 6/2014 | Chen et al. |
| 2015/0171666 A1 | 6/2015 | Yeon et al. |
| 2016/0134160 A1 | 5/2016 | Schultz et al. |
| 2018/0115178 A1* | 4/2018 | Moon ................ G01R 31/3835 |
| 2019/0148957 A1* | 5/2019 | Masuda .................... B60L 3/04 320/127 |
| 2020/0014077 A1* | 1/2020 | Tabatowski-Bush ........................ H02J 7/00036 |
| 2022/0006303 A1* | 1/2022 | Chen ................. H01M 10/4257 |

FOREIGN PATENT DOCUMENTS

| | | |
|---|---|---|
| CN | 106410879 A | 2/2017 |
| CN | 106532801 A | 3/2017 |
| DE | 27 32 794 A1 | 2/1979 |
| DE | 195 33 537 A1 | 3/1997 |
| DE | 10 2013 220 609 A1 | 4/2015 |
| EP | 2 720 309 A2 | 4/2014 |
| EP | 3 288 135 A1 | 2/2018 |
| JP | 2002-10503 A | 1/2002 |
| JP | 2003-309937 A | 10/2003 |
| JP | 2008-226673 A | 9/2008 |
| JP | 2012-175801 A | 9/2012 |
| JP | 2013-219936 A | 10/2013 |
| JP | 2014-139508 A | 7/2014 |
| JP | 2014-220874 A | 11/2014 |
| KR | 10-0872198 B1 | 1/2007 |
| KR | 10-2013-0104149 A | 9/2013 |
| KR | 10-1480090 B1 | 1/2015 |
| KR | 20150062050 * | 6/2015 |
| KR | 10-1538232 B1 | 7/2015 |
| KR | 10-2016-0024603 A | 3/2016 |
| KR | 10-1621407 B1 | 5/2016 |
| KR | 10-2017-0027513 A | 3/2017 |
| WO | WO 2013/136655 A1 | 9/2013 |

OTHER PUBLICATIONS

International Search Report (PCT/ISA/210) issued in PCT/KR2018/002536, dated Jun. 11, 2018.

Feibao Soon: "Electric Bus Battery Management System Module Strategy Design", China Academic Journal Electronic Publishing House. Published on Sep. 15, 2015.

* cited by examiner

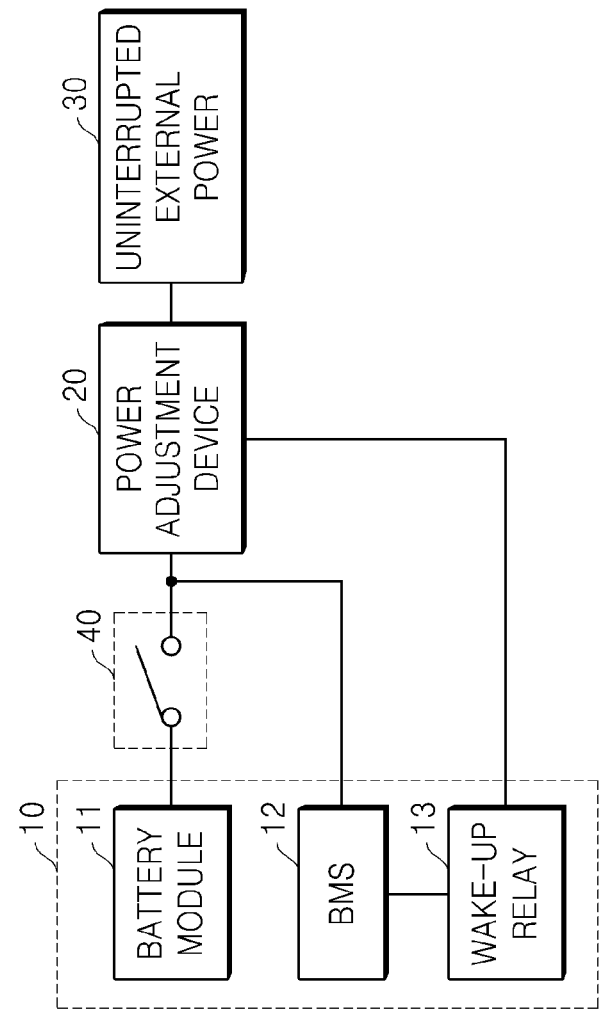
[fig1]

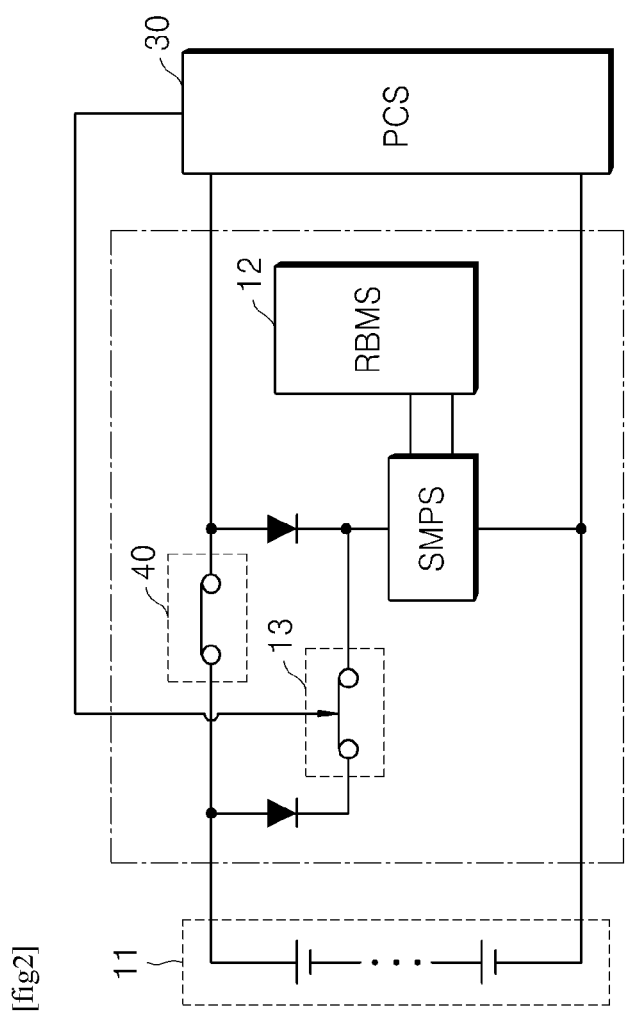

[fig3]
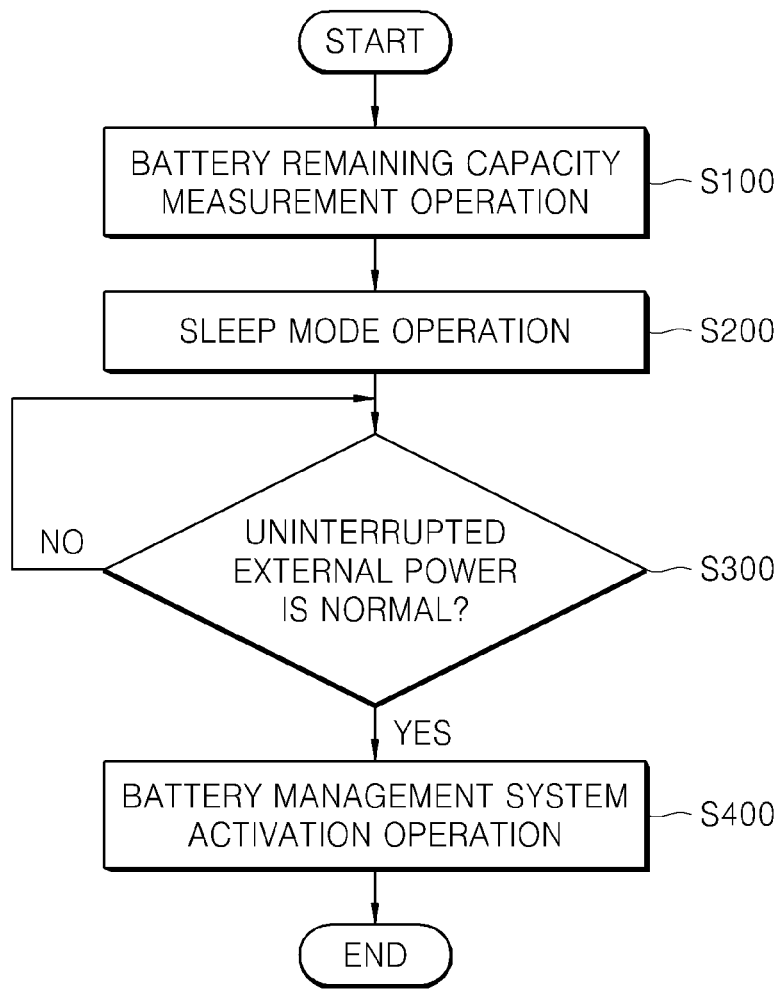

DEVICE AND METHOD FOR PREVENTING OVER-DISCHARGE OF ENERGY STORAGE DEVICE AND RE-OPERATING SAME

TECHNICAL FIELD

The present invention relates to a device and method for waking up an MCU operating in a sleep mode.

BACKGROUND ART

Recently, there is an increased interest in an Energy Storage System (ESS) that stores and uses power when it is needed.

First, a difference between a battery and an ESS is in that the battery stores the DC power and simply outputs the DC power, but the ESS converts AC into DC and stores it, converts the stored DC into AC and outputs it, and controlling the supply and output of electricity through a PCS.

In other words, the ESS is a system that integrally manages and controls power in linkage with various products such as a PCS, a PMS, and a battery.

On the other hand, the PCS of the ESS may perform a charging function for converting AC into DC when the power is stored in the battery with uninterrupted power supply, and a function of converting the DC power outputted from the battery to AC to discharge it.

In this case, the PSC is always powered when the power is always connected and is driven by the battery power when the power is off.

Meanwhile, the PMS of the ESS may perform the function of managing and integrating one or more ESSs.

Meanwhile, the battery of the ESS further includes a battery management system. When the remaining capacity of the battery becomes less than a predetermined value, the discharge of the battery is cut off, and the battery management system operates in a sleep mode.

When the battery management system operates in the sleep mode, the battery may not be charged even when an external power source is connected to the battery, and the battery may not be discharged to the outside, thereby failing to perform a normal battery function.

In order to activate the battery management system operating in the sleep mode, there is a problem that the user must directly turn on the switch.

Therefore, in the present invention, when the uninterrupted power supply is connected to the ESS, suggested are a device and method for activating a battery management system operating in a sleep mode using a PCS driven with the uninterrupted power supply.

DISCLOSURE OF THE INVENTION

Technical Problem

The present invention provides a device and method for activating a battery management system operating in a sleep mode.

More particularly, the present invention provides a device and method for activating a battery management system in a sleep mode using a PCS turned on when an uninterrupted power supply connected.

Technical Solution

Embodiments of the present invention provide an energy storage system including: an external power input unit configured to receive uninterrupted external power; a battery configured to store electric power; a power adjustment device configured to adjust the uninterrupted external power and the power of the battery; wherein the battery includes: a battery module including one or more battery cells; a battery management system; a main switch disposed on a power path between the battery module and the battery management system and a path between the battery module and the power adjustment device; and a wake-up relay configured to receive a wake-up signal from the power adjustment device and transmit the wake-up signal to the battery management system, wherein when the remaining capacity of tire battery module becomes equal to or less than a predetermined capacity, the battery management system turns off the main switch and disconnects the battery module from the battery management system to enter a sleep mode, wherein the power adjustment device receives a driving power from the uninterrupted external power when the battery module is in a charge state, and from the battery module when the battery module is in a discharge state.

The power adjustment device may include a control unit for determining whether the uninterrupted external power is connected to the external power input unit to control the wake-up relay, wherein when it is determined that the control unit is in the uninterrupted external power connection state, the power adjustment device may supply the uninterrupted external power to the battery module to charge the battery module, wherein when the control unit determines that the uninterrupted external power is connected, the power adjustment device may supply the uninterrupted external power to the battery module to charge the battery module, and wherein when the control unit determines that the uninterrupted external power is not connected, the power adjustment device may discharge the power of the battery module to the outside.

While the uninterrupted external power supplied to the power adjustment device and the battery power are both cut off and are in an OFF state, only when the uninterrupted external power is supplied and the power adjustment device is turned on, the control unit may generate a wake-up relay-on signal and inputs it to the wake-up relay.

The wake-up relay may have one end connected to the control unit of the power adjustment device and may be turned on when receiving a wake-up relay-on signal from the control unit of the power adjustment device to allow the power of the battery module to be inputted to the battery management system operating in the sleep mode through connection, thereby activating the battery management system operating in the sleep mode.

After the activation, the battery management system may turn on the main switch and turns off the wake-up relay.

In other embodiments of the present invention, an overdischarge prevention and restart method of an energy storage system includes: measuring a remaining capacity of a battery module constituting the energy storage system in the battery management system, in a battery module remaining capacity measurement operation; blocking the discharge of the battery module and switching the battery management system to a sleep mode when the measured battery module remaining capacity is equal to or less than a predetermined capacity, in an overdischarge prevention operation of the energy storage system; determining whether an uninterrupted external power of the energy storage system is abnormal in a power adjustment device while the battery management system is in a sleep mode in an uninterrupted external power abnormality determination operation; activating the battery management system to restart the energy storage system when the uninterrupted external power is normal according to a determination on whether the uninterrupted external power of the energy storage system is abnormal, in an energy storage system restart operation.

The energy storage system restart operation may maintain the sleep mode of the battery management system continuously when it is determined that the uninterrupted external power is abnormal, wherein the activating of the battery management system when the uninterrupted external power is normal includes: generating a wake-up relay-on signal in a control unit of the power adjustment device, in a wake-up relay-on signal generation operation; inputting the generated wake-up relay-on signal to the wake-up relay, in a wake-up signal input operation, and turning on the wake-up relay that receives the wake-up relay-on signal, in a wake-up relay-on operation, wherein when the wake-up relay is on, the power of the battery module may inputted to the battery management system operating in the sleep mode, and the battery management system operating in the sleep mode may be activated.

When the battery management system operating in the sleep mode is activated, the battery management system turns on the main switch and turns off the wake-up relay.

Advantageous Effects

The present invention may automatically wake-up the BMS of the sleep mode battery when uninterrupted external power is inputted to an ESS.

BRIEF DESCRIPTION OF THE DRAWINGS

FIG. 1 is an overall configuration diagram of an overdischarge prevention and restart device of an ESS according to an embodiment of the present invention.

FIG. 2 is an actual circuit diagram of an overdischarge prevention and restart device of an ESS according to an embodiment of the present invention.

FIG. 3 is a flowchart of a method for overdischarge prevention and restart of an ESS according to an embodiment of the present invention.

MODE FOR CARRYING OUT THE INVENTION

Hereinafter, embodiments of the present invention will be described in detail with reference to the accompanying drawings so that those skilled in the art can easily carry out the present invention. The present invention may, however, be embodied in different forms and should not be construed as limited to the embodiments set forth herein. Parts not relating to description are omitted in the drawings in order to clearly describe the present invention and like reference numerals refer to like elements throughout.

Although the terms "first," "second," etc., may be used herein to describe various elements, these elements should not be limited by these terms. The above terms are used only to distinguish one component from another. For example, a first component may be referred to as a second component and vice versa without departing from the scope of the present invention. Terms used in this specification are used to describe specific embodiments, and are not intended to limit the scope of the present invention. The singular expressions include plural expressions unless the context clearly dictates otherwise.

Throughout the specification, when a portion is referred to as being "connected" to another portion, it includes not only "directly connected" but also "electrically connected" with another element therebetween. Furthermore, when it is described that one comprises (or includes or has) some elements, it should be understood that it may comprise (or include or has) only those elements, or it may comprise (or include or have) other elements as well as those elements when there is no specific limitation. The term "~ing operation" or "operation of ~ing" used throughout the specification does not mean "operation for ~ing".

Terms used in this specification may be currently widely used general terms in consideration of functions in the present invention but may vary according to the intents of those skilled in the art, precedents, or the advent of new technology. Additionally, in certain cases, there may be terms the applicant selects arbitrarily and in this case, their meanings are described in a corresponding description part of the present invention. Accordingly, terms used in the present invention should be defined based on the meaning of the term and the entire contents of the present invention instead of the simple term name.

1. Device for Energy Storage System (ESS) Overdischarge Prevention and Restart According to Embodiment of Present Invention FIG. 1 is an overall configuration diagram of an overdischarge prevention and restart device of an ESS according to an embodiment of the present invention, and FIG. 2 is an actual circuit diagram of an overdischarge prevention and restart device of an ESS according to an embodiment of the present invention.

Hereinafter, an overdischarge prevention and restart device of an ESS according to an embodiment of the present invention will be described with reference to FIGS. 1 and 2.

An ESS according to an embodiment of the present invention includes an external power input unit to which an external power source 30 is always inputted, a battery 10 for storing power, and a power adjustment device 20 for adjusting the uninterrupted external power source 30 and the battery 10. The battery 10 includes a battery module 11 composed of one or more battery cells, a battery management system 12, a main switch 40 disposed on a path between the battery module 11 and the battery management system 12 and a path between the battery module 11 and the power adjustment unit 20, and a wake-up relay 13 for receiving a wake-up ON signal from the power adjustment device 20 and transmitting a wake-up signal to the battery management system. When the remaining capacity of the battery module becomes equal to or less than the predetermined capacity, the battery management system 12 enters a sleep mode by turning off the main switch 40 to cut off the connection between the battery module 11 and the battery management system 12. When the battery module 11 is in a charge state, the power adjustment unit 20 may receive the driving power from the uninterrupted external power source 30 from the battery module 11 in a discharge state.

More specifically, when the remaining capacity of the battery module 11 becomes equal to or less than the predetermined capacity, the battery management system 12 may turn off the main switch 40 and cut off the connection between the battery module 11 and the battery management system 12 to enter a sleep mode.

On the other hand, the power adjustment device 20 may receive driving power from the uninterrupted external power when the battery module is in the charge state, and from the battery module when the battery module is in the discharge state.

More specifically, the power adjustment device 20 includes a control unit for determining whether the uninterrupted external power 30 is connected to the external power input unit of the ESS and controlling the wake-up relay 13.

More specifically, in relation to whether the uninterrupted external power 30 is supplied, the control unit determines that when a predetermined voltage or current is inputted from the output terminal of the uninterrupted external power to the input unit of the power adjustment device, the uninterrupted external power 30 is connected, and when a predetermined voltage or current is not inputted from the output terminal of the uninterrupted external power 30 to the input unit of the power adjustment device, the uninterrupted external power 30 is not connected.

Meanwhile, when the control unit determines that the uninterrupted external power 30 is connected, the power adjustment device 20 is driven by the power of the uninterrupted external power 30 to convert at least one of voltage, current, frequency, and phase of the uninterrupted external power 30 to charge the battery module 11, and when the control unit determines that the uninterrupted external power 30 is not connected, the power adjustment device 20 is driven by the power of the battery module 11 and converts at least one of voltage, current, frequency, and phase of the battery module 11 to discharge the battery module 11, thereby driving an electronic device.

Meanwhile, situations where the uninterrupted external power 30 is not connected and the uninterrupted external power 30 is abnormal may be cases where there is no uninterrupted external power inputted to the external power input unit of the ESS.

That is, when the uninterrupted external power 30 is connected, the power adjustment device 20 may be driven by the uninterrupted external power 30 and when the uninterrupted external power 30 is disconnected, may be powered by the battery module 11.

Therefore, the power adjustment device 20 may be turned off when the external power source 30 is not connected, the capacity of the battery module 11 is less than the predetermined capacity, and the discharge of the battery module 11 is blocked.

Meanwhile, only when the uninterrupted external power 30 supplied to the power adjustment device 20 and the power of the battery module 11 are both cut off and the uninterrupted external power 30 is supplied again, the control unit of the power adjustment device 20 generates a wake-up relay-on signal for turning on the wake-up relay 13 and inputs the signal to the wake-up relay 13.

That is, only when the power adjustment device 20 is turned off and then turned on by the re-supply of the uninterrupted external power 30, the control unit of the power adjustment device may generate the wake-up relay-on signal.

Meanwhile, when the input terminal of the wake-up relay is connected to the control unit of the power adjustment device 20 and receives a wake-up relay-on signal from the control unit of the power adjustment device 20, the relay is turned on. The wake-up relay 13 connects them to allow the power of the uninterrupted battery module 11 to be inputted to the battery management system 12 operating in the sleep mode, so that the battery management system operating in the sleep mode may be activated.

Meanwhile, after the battery management system 12 is activated, the main switch 40 may be turned on and the wake-up relay 13 may be turned off.

The reason that the battery management system 12 turns on the main switch 40 and turns off the wake-up relay 13 when the remaining capacity of the battery module 11 becomes a predetermined value or less is to operate the system 12 again in the sleep mode.

That is, when the wake-up relay 13 is in an ON state continuously, the remaining capacity of the battery module 11 in the battery management system 12 is less than the predetermined capacity and thus it operates in the sleep mode, and the power of the battery module 11 continues to activate the battery management system. Even when the remaining capacity of the battery module 11 becomes a predetermined value or less, continuous discharge may occur so that damage to the battery module 11 may occur.

Therefore, in order to prevent the battery module 11 from being damaged, when the main switch 40 is turned on after the battery management system 12 is activated, the wake-up relay 13 must be turned off.

2. Method for Overdischarge Prevention and Restart of ESS According to an Embodiment of Present Invention FIG. 3 is a flowchart of a method for overdischarge prevention and restart of an ESS according to an embodiment of the present invention.

Hereinafter, a method for overdischarge prevention and restart of an ESS according to an embodiment of the present invention will be described.

The method for overdischarge prevention and restart of an ESS according to an embodiment of the present invention includes a battery remaining capacity measurement operation S100 for measuring the remaining capacity of the battery constituting the ESS in the battery management system, an overdischarge prevention operation S200 of the ESS for preventing a discharge of a battery and operating the battery management system in a sleep mode when the measured remaining battery capacity is equal to or less than a predetermined capacity, an uninterrupted external power abnormality determination operation S300 for determining whether an uninterrupted external power of the ESS is abnormal in a power adjustment device while the battery management system operates in a sleep mode, and an ESS restart operation S400 for restarting the ESS by activating the battery management system when it is determined that the external power source is normal according to of the uninterrupted external power connection of the ESS.

More specifically, the battery remaining capacity measurement operation S100 may measure the remaining capacity of the battery in the battery management system as described above, but is not limited thereto and may be calculated by a battery management system based on the formula, or may be measured or calculated by a separate external device.

On the other hand, the overdischarge prevention operation S200 of the ESS measures the remaining capacity of the battery. When the remaining capacity of the battery becomes less than the predetermined capacity, the discharge may be continued to prevent the battery from being damaged.

On the other hand, the operation of the battery management system in the sleep mode means a state in which there is an abnormal uninterrupted external power in the ESS and the capacity of the battery module becomes equal to or less than the predetermined capacity as power is supplied from the battery module of the ESS to the external electronic device so that the discharge of the battery module is blocked. Therefore, the ESS may not be connected to uninterrupted external power.

Therefore, when the control unit of the ESS determines that the uninterrupted external power is abnormal, the sleep mode of the battery management system may be maintained.

On the other hand, when the control unit of the ESS determines that there is no uninterrupted external power, a wake-up relay-on signal generation operation for generating a wake-up relay-on signal in the control unit of the power adjustment device, a wake-up signal input operation for inputting the generated wake-up relay-on signal to the wake-up relay, and a wake-up relay-on operation for turning on the wake-up relay receiving the wake-up relay-on signal may be sequentially performed to turn on the wake-up relay.

When the wake-up relay is turned on, the power of the battery module is inputted to the battery management system operating in the sleep mode, so that the battery management system operating in the sleep mode may be activated.

Meanwhile, when the battery management system operating in the sleep mode is activated, the battery management system may further perform an operation of turning on the main switch and turning off the wake-up relay.

The reason that the battery management system turns on the main switch and turns off the wake-up relay is to allow the battery management system to operate again in the sleep mode when the remaining capacity of the battery becomes less than a predetermined value.

That is, when the wake-up relay is in an ON state continuously, the remaining capacity of the battery in the battery management system 12 less than the predetermined capacity and thus it operates in the sleep mode, and the power of the battery module continues to activate the battery management system. Even when the remaining capacity of the battery module becomes a predetermined value or less, continuous discharge may occur so that damage to the battery module may occur.

Therefore, in order to prevent the battery module from being damaged, when the main switch is turned on after the battery management system is activated, the wake-up relay must be turned off.

On the other hand, although the technical idea of the present invention is specifically described with reference to the above embodiments, it should be noted that the above embodiments are for the purpose of explanation and not for the purpose of limitation. It will be apparent to those skilled in the art that various modifications and variations can be made in the present invention without departing from the spirit and scope of the invention.

The invention claimed is:

1. An energy storage system comprising:
an external power input unit configured to receive uninterrupted external power;
a battery configured to store electric power;
a power adjustment device configured to adjust the uninterrupted external power and the power of the battery;
wherein the battery comprises:
a battery module including one or more battery cells;
a battery management system (BMS);
a main switch disposed on a power path between the battery module and the BMS and a path between the battery module and the power adjustment device; and
a wake-up relay electrically connected to the power adjustment device and configured to receive a wake-up signal from the power adjustment device and transmit the wake-up signal to the BMS,
wherein when the remaining capacity of the battery module becomes equal to or less than a predetermined capacity, the BMS is configured to turn off the main switch and disconnect the battery module from the BMS to enter a sleep mode,
wherein the power adjustment device receives a driving power from the uninterrupted external power when the battery module is in a charge state, and from the battery module when the battery module is in a discharge state, and
wherein the power adjustment device is separate from the BMS.

2. The energy storage system of claim 1, wherein the power adjustment device comprises a control unit for determining whether the uninterrupted external power is connected to the external power input unit to control the wake-up relay,
wherein when it is determined that the control unit is in the uninterrupted external power connection state, the power adjustment device supplies the uninterrupted external power to the battery module to charge the battery module,
wherein when the control unit determines that the uninterrupted external power is connected, the power adjustment device supplies the uninterrupted external power to the battery module to charge the battery module, and
wherein when the control unit determines that the uninterrupted external power is not connected, the power adjustment device discharges the power of the battery module to the outside.

3. The energy storage system of claim 2, wherein while the uninterrupted external power supplied to the power adjustment device and the battery power are both cut off and are in an OFF state, only when the uninterrupted external power is supplied and the power adjustment device is turned on, the control unit generates a wake-up relay-on signal and inputs it to the wake-up relay.

4. The energy storage system of claim 2, wherein the wake-up relay has one end connected to the control unit of the power adjustment device and is turned on when receiving a wake-up relay-on signal from the control unit of the power adjustment device to allow the power of the battery module to be inputted to the BMS operating in the sleep mode through connection, thereby activating the BMS operating in the sleep mode.

5. The energy storage system of claim 4, wherein after the activation, the BMS turns on the main switch and turns off the wake-up relay.

6. The energy storage system of claim 1, wherein the BMS is connected to a first node between the main switch and the power adjustment device.

7. The energy storage system of claim 6, wherein the power adjustment device is positioned between the first node and the uninterrupted external power.

8. An overdischarge prevention and restart method of an energy storage system, the method comprising:
measuring a remaining capacity of a battery module constituting the energy storage system in the battery management system (BMS), in a battery module remaining capacity measurement operation;
blocking the discharge of the battery module and switching the BMS to a sleep mode when the measured battery module remaining capacity is equal to or less than a predetermined capacity, in an overdischarge prevention operation of the energy storage system;
determining whether an uninterrupted external power of the energy storage system is abnormal in a power adjustment device of the energy storage system while the BMS is in a sleep mode, in an uninterrupted external power abnormality determination operation; and
activating the BMS to restart the energy storage system when the uninterrupted external power is normal according to a determination on whether the uninterrupted external power of the energy storage system is abnormal, in an energy storage system restart operation, wherein the energy storage system includes a wake-up relay electrically connected to the power adjustment device, and wherein the power adjustment device is separate from the BMS.

9. The method of claim 8, wherein the energy storage system restart operation maintains the sleep mode of the BMS continuously when it is determined that the uninterrupted external power is abnormal, wherein the activating of the BMS when the uninterrupted external power is normal comprises:

generating a wake-up relay-on signal in a control unit of the power adjustment device, in a wake-up relay-on signal generation operation;

inputting the generated wake-up relay-on signal to the wake-up relay, in a wake-up signal input operation; and turning on the wake-up relay that receives the wake-up relay-on signal, in a wake-up relay-on operation, wherein when the wake-up relay is on, the power of the battery module is inputted to the BMS operating in the sleep mode, and the BMS operating in the sleep mode is activated.

10. The method of claim 9, wherein when the BMS operating in the sleep mode is activated, the BMS turns on the main switch and turns off the wake-up relay.

11. The method of claim 8, wherein the BMS is connected to a node between the main switch and the power adjustment device.

12. The method of claim 11, wherein the power adjustment device is positioned between the first node and the uninterrupted external power.

\* \* \* \* \*